(12) United States Patent
Nakamura et al.

(10) Patent No.: US 9,972,479 B2
(45) Date of Patent: May 15, 2018

(54) TARGET ASSEMBLY

(71) Applicant: ULVAC, INC., Kanagawa (JP)

(72) Inventors: Shinya Nakamura, Kanagawa (JP);
Yoshihiro Ikeda, Kanagawa (JP);
Yoshinori Fujii, Kanagawa (JP);
Yuusuke Miyaguchi, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days. days.

(21) Appl. No.: 15/329,129

(22) PCT Filed: Jun. 18, 2015

(86) PCT No.: PCT/JP2015/003065
§ 371 (c)(1),
(2) Date: Jan. 25, 2017

(87) PCT Pub. No.: WO2016/021101
PCT Pub. Date: Feb. 11, 2016

(65) Prior Publication Data
US 2017/0229296 A1   Aug. 10, 2017

(30) Foreign Application Priority Data

Aug. 8, 2014   (JP) .................................. 2014-163095

(51) Int. Cl.
*H01J 37/34* (2006.01)
*C23C 14/34* (2006.01)
*C23C 14/08* (2006.01)

(52) U.S. Cl.
CPC ........ *H01J 37/3435* (2013.01); *C23C 14/081* (2013.01); *C23C 14/3407* (2013.01); *H01J 37/3426* (2013.01); *H01J 37/3497* (2013.01)

(58) Field of Classification Search
CPC ............... H01J 37/3497; H01J 37/3426; H01J 37/3435; H01J 37/3414; C23C 14/3407; C23C 14/081
See application file for complete search history.

(56) References Cited

U.S. PATENT DOCUMENTS

| | | | | |
|---|---|---|---|---|
| 6,955,748 B2* | 10/2005 | Kim | .................... | C23C 14/3407 204/298.12 |
| 7,026,009 B2* | 4/2006 | Lin | .......................... | C23C 4/12 117/85 |
| 2002/0162741 A1* | 11/2002 | Gogh | .................. | C23C 14/3407 204/298.12 |

FOREIGN PATENT DOCUMENTS

| | | |
|---|---|---|
| JP | 57-194254 A | 11/1982 |
| JP | 04-252091 A | 9/1992 |

(Continued)

OTHER PUBLICATIONS

International Search Report and Written Opinion for PCT Patent App. No. PCT/JP2015/003065 (dated Sep. 15, 2015) with English language translation of the ISR.

*Primary Examiner* — Michael A Band
(74) *Attorney, Agent, or Firm* — Cermak Nakajima & McGowan LLP; Tomoko Nakajima

(57) ABSTRACT

A target assembly is provided which is capable of preventing abnormal discharging from being generated between a projected portion of a backing plate and a side surface of a target, and which is also capable of surely preventing a bonding material that bonds the target and the backing plate together from seeping to the outside. The backing plate has a projected portion which is projected outward beyond an outer peripheral end of the target, and an annular shield plate is disposed to lie opposite to the projected portion so as to enclose the target in a state in which the target assembly is assembled onto a sputtering apparatus (SM). That portion of (Continued)

the backing plate to which the target gets bonded is defined as a bonding portion, and this bonding portion is protruded relative to the projected portion.

2 Claims, 4 Drawing Sheets

(56) References Cited

FOREIGN PATENT DOCUMENTS

| | | |
|---|---|---|
| JP | 04-276066 A | 10/1992 |
| JP | 07-292465 A | 11/1995 |
| JP | 11-236663 A | 8/1999 |
| JP | 2002-146523 A | 9/2002 |
| JP | 2008-174787 A | 7/2008 |
| JP | 2010-255052 A | 11/2010 |
| JP | 2012-021233 A | 2/2012 |

* cited by examiner

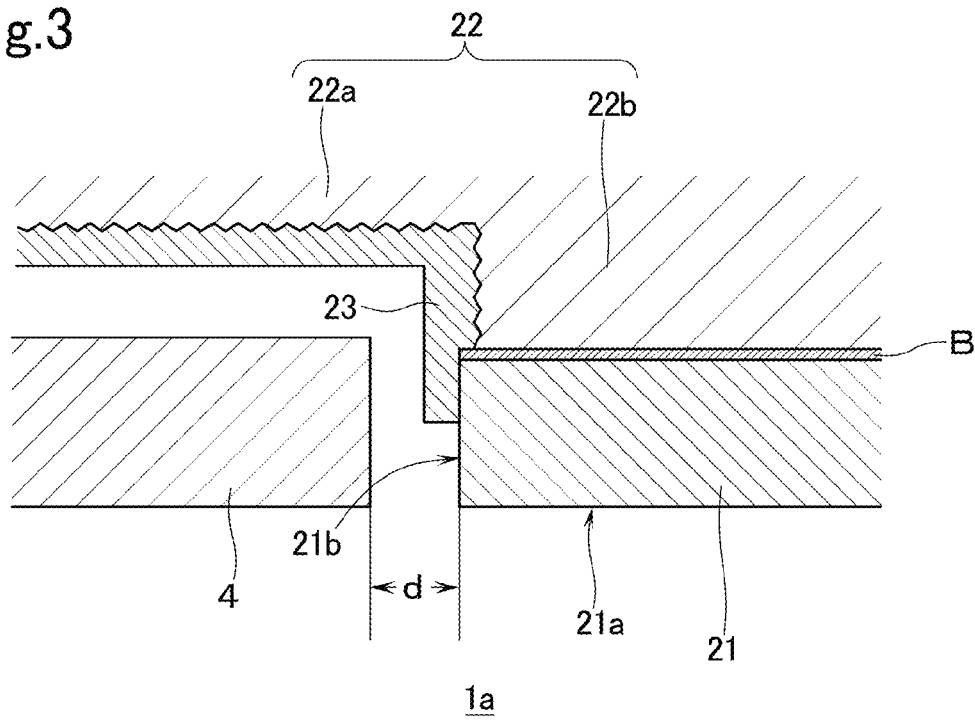
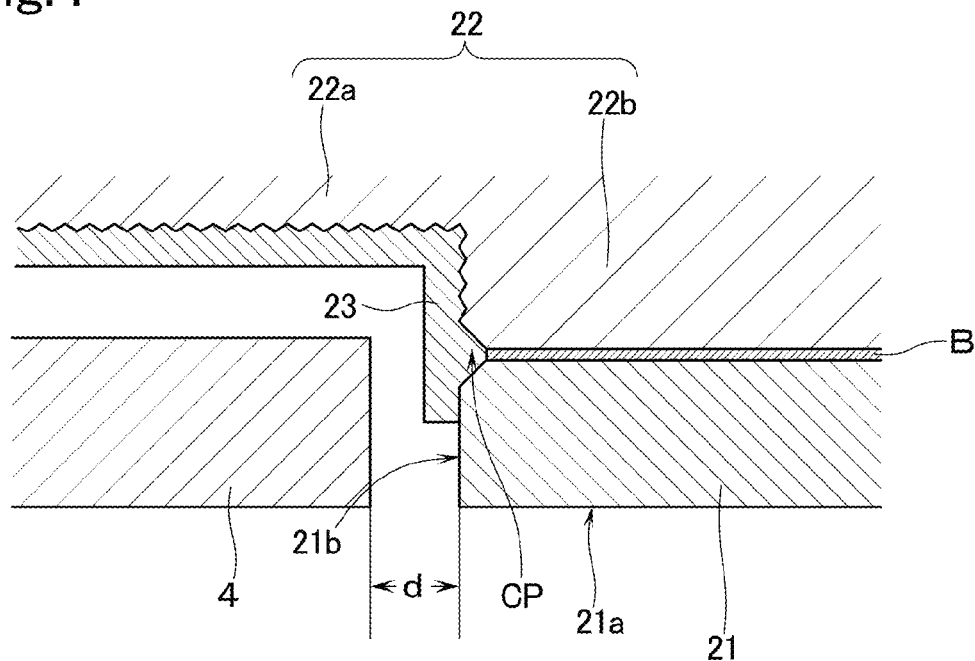

TARGET ASSEMBLY

This application is a national phase entry under 35 U.S.C. § 371 of PCT Patent Application No. PCT/JP2015/003065, filed on Jun. 18, 2015, which claims priority under 35 U.S.C. § 119 to Japanese Patent Application No. 2014-163095, filed Aug. 8, 2014, both of which are incorporated by reference.

TECHNICAL FIELD

The present invention relates to a target assembly which is assembled onto a sputtering apparatus and relates, in particular, to a target assembly having a target made of an insulating material and a backing plate bonded to one surface of the target by means of a bonding material.

BACKGROUND ART

For example, in the processes of manufacturing a NAND flush memory or a MRAM (magneto-resistive random-access memory), processes of forming insulator films such as aluminum oxide films, magnesium oxide films, and the like are carried out. Sputtering apparatus is used in order to form insulator films with good productivity. In this kind of sputtering apparatus, a target assembly is assembled, in a detachable manner, onto a vacuum chamber which is capable of being evacuated, the target assembly having integrated together: a target appropriately selected depending on the composition of the thin film to be formed; and a backing plate for cooling the target at the time of film forming by sputtering.

This kind of target assembly is known, e.g., in Patent Document 1. According to this arrangement, the backing plate is formed of metal such as copper with good thermal conduction, and has a projected portion projected outward beyond an outer peripheral end of the target. By taking advantage of this projected portion, it is so arranged that the target assembly can be fixed to a predetermined position of the sputtering apparatus. Further, after having assembled the target assembly onto the sputtering apparatus, an annular shield plate is generally disposed opposite to the projected portion, for the purpose of stabilizing the discharging, etc.

By the way, in a state in which the target assembly and the shield plate have been assembled onto the sputtering apparatus, there is a clearance between the target and the shield plate. When plasma is caused to be generated in the vacuum chamber at the time of film forming, the electrons in the plasma will sometimes be electrostatically charged, through the above-mentioned clearance, in the projected portion that is made of metal. When the projected portion gets charged with electrons, due to the fact that the target is made of an insulating material, abnormal discharging occurs due to the potential difference between the side surface of this target and the projected portion. Due to this phenomenon, there is a case in which the bonding material gets seeped to the outside. If film forming is performed in this kind of state, there will occur so-called contamination in which metal gets mixed into the insulation film that is formed on the surface of a substrate. This will prevent good film formation. As a solution, in order not to expose that bonded surface between the target and the backing plate in which the bonding material exists, it is considered to form a film made of an insulating material (hereinafter called an "insulator film") so as to bridge over the side surface of the target to the projected portion. However, since the target of an insulating material is manufactured by sintering, its outside surface is smooth. Therefore, even if the insulator film is formed, e.g., by spray coating, and the like, the adhesive force of the film is extremely weak, thereby giving rise to the problem in that the insulator film will easily be peeled off.

PRIOR ART DOCUMENT

Patent Document

Patent Document 1: JP-2010-255052 A

SUMMARY OF THE INVENTION

Problems that the Invention is to Solve

In view of the above points, this invention has a problem of providing a target assembly which is capable of preventing abnormal discharging from occurring between the projected portion of the backing plate and the side surface of the target, and which is also capable of surely preventing the bonding material that bonds the target and the backing plate together from seeping to the outside.

Means of Solving the Problems

In order to solve the above problems, the target assembly according to this invention comprises: a target made of an insulating material; and a backing plate bonded to one surface of the target by means of a bonding material. The backing plate has a projected portion which is projected outward beyond an outer peripheral end of the target. An annular shield plate is disposed to lie opposite to the projected portion so as to enclose the target in a state in which the target assembly is assembled onto a sputtering apparatus. The target assembly is characterized in: that, where that portion of the backing plate to which the target gets bonded is defined as a bonding portion, the bonding portion is protruded relative to the projected portion; that an external surface of the backing plate is roughened over an area from the projected portion to a side surface of the bonding portion; and that an insulator film is formed to bridge from the projected portion over into a side surface of the target.

According to this invention, even if there is a clearance between the target and the shield plate, from the projected portion inclusive of that projected portion of the backing plate to which faces the plasma caused to be generated between the target and a substrate, to the side surface of the target are covered by the insulator film. Even in case the electrons in the plasma are charged in the projected portion through the above-mentioned clearance, abnormal discharging will not be induced. In addition, the backing plate is provided with the bonding portion that is directed toward the thickness direction of the target, and the insulator film is arranged to be continuously formed from the front surface of the roughened bonding portion to the side surface of the target. Therefore, there can be obtained a construction in which the insulator film is less likely to be peeled off than the case of the above-mentioned prior art. As a result, the bonded surface of the target and the backing plate in which the bonding material is present will be covered by the insulator film without exposure. Therefore, the bonding material can surely be prevented from seeping to the outside.

In this invention, the insulator film shall preferably be formed by spraying coating. According to this arrangement, as a combined effect of the fact that the side surface of the bonding portion of the above-mentioned backing plate is roughened, the insulator film can be prevented from being peeled off from the side surface of the target.

In this invention, preferably that peripheral edge of the bonding portion which is along the surface bonded with the target, and that peripheral edge of the target which is along the surface bonded with the bonding portion are respectively chamfered, and the insulator film is formed in a recessed portion defined by the chamfered bonding portion and the chamfered target. According to this arrangement, the thickness of the insulating film that covers the bonded surface between the target and the backing plate can be made larger than that of the surrounding portion. The insulator film can be made to be less likely to be peeled off, and also the bonding material can more surely be prevented from seeping to the outside.

In this invention, preferably the bonding portion has a smaller outer dimension than the outer dimension of the target, and a thickness of the insulator film covering the side surface of the bonding portion is larger than a thickness of the insulator film covering the side surface of the target. According to this arrangement, the insulation characteristics of the insulator film are enhanced, and abnormal discharging can more surely be prevented. At the same time, the adhesive properties at the side surface of the bonding portion can be enhanced, thereby more surely preventing the peeling off of the insulation film.

BRIEF DESCRIPTION OF THE DRAWINGS

FIG. 3 is a sectional view showing in enlargement essential portion of a modified example of the target assembly.

FIG. 4 is a sectional view showing in enlargement essential portion of a modified example of the target assembly.

MODES FOR CARRYING OUT THE INVENTION

With reference to the accompanying drawings, a description will be made of a target assembly according to an embodiment of this invention by referring to an example which is assembled onto a sputtering apparatus. In the following description, the side of the ceiling portion of the vacuum chamber 1 is defined as "top or upper", and the bottom side thereof is defined as "bottom or lower" with FIG. 1 serving as a standard.

Figure 1:
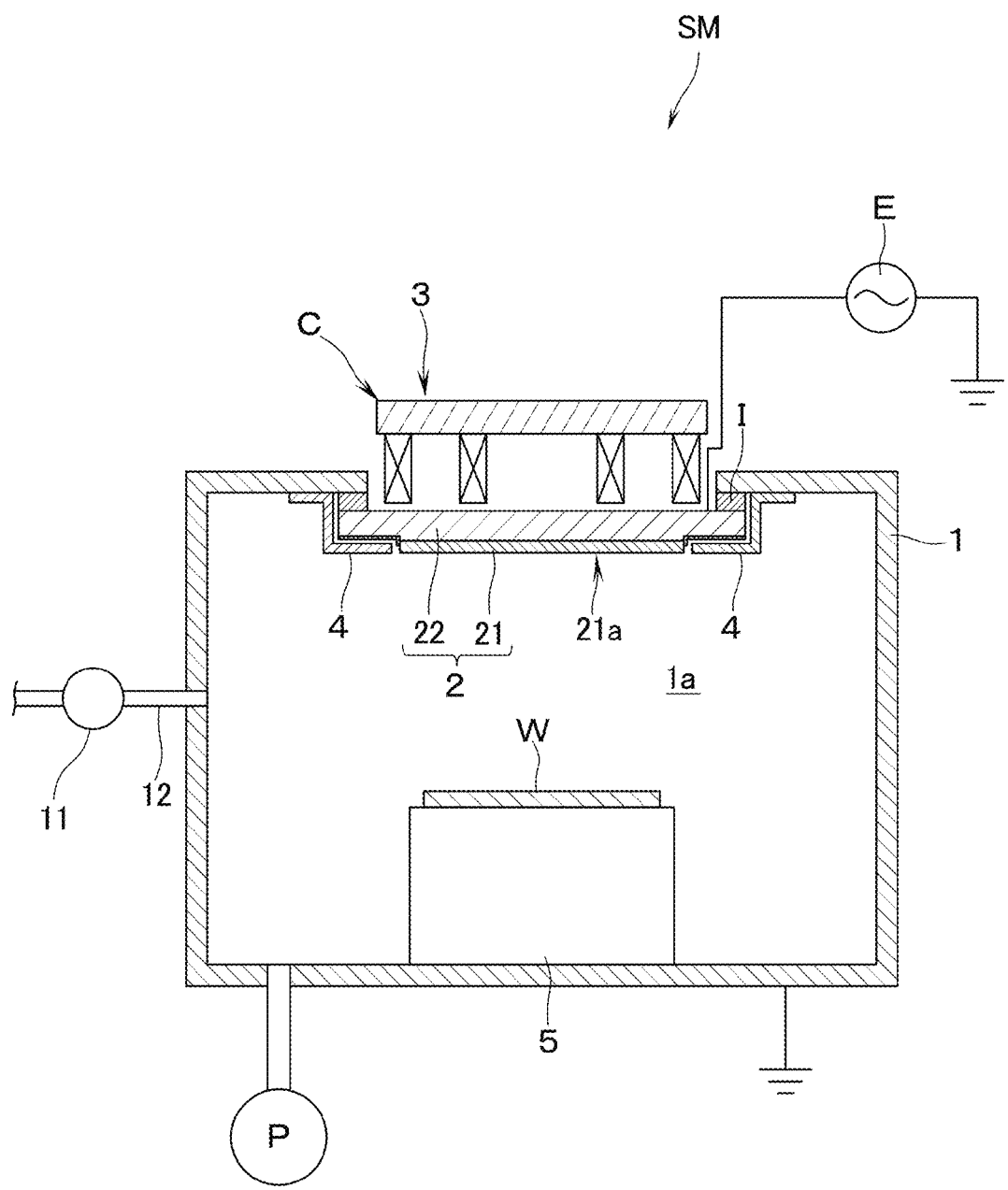
FIG. 1 is a schematic sectional view of a sputtering apparatus onto which a target assembly according to an embodiment of this invention has been assembled.

As shown in FIG. 1, the sputtering apparatus SM is provided with a vacuum chamber 1 which defines a processing chamber 1a. To the bottom portion of the vacuum chamber 1, there is connected, through an exhaust pipe, a vacuum pump P which is made up of a turbo molecular pump, a rotary pump, and the like. It is thus so arranged that the vacuum chamber 1 can be evacuated to a predetermined pressure (e.g., $1 \times 10^{-5}$ Pa). To the side wall of the vacuum chamber 1, there is connected a gas pipe 12 which is communicated with a gas source (not illustrated) and which has interposed therein a mass flow controller 11. It is thus so arranged that a sputtering gas made up of a rare gas such as Ar can be introduced into the processing chamber 1a at a predetermined flow rate.

Figure 2:
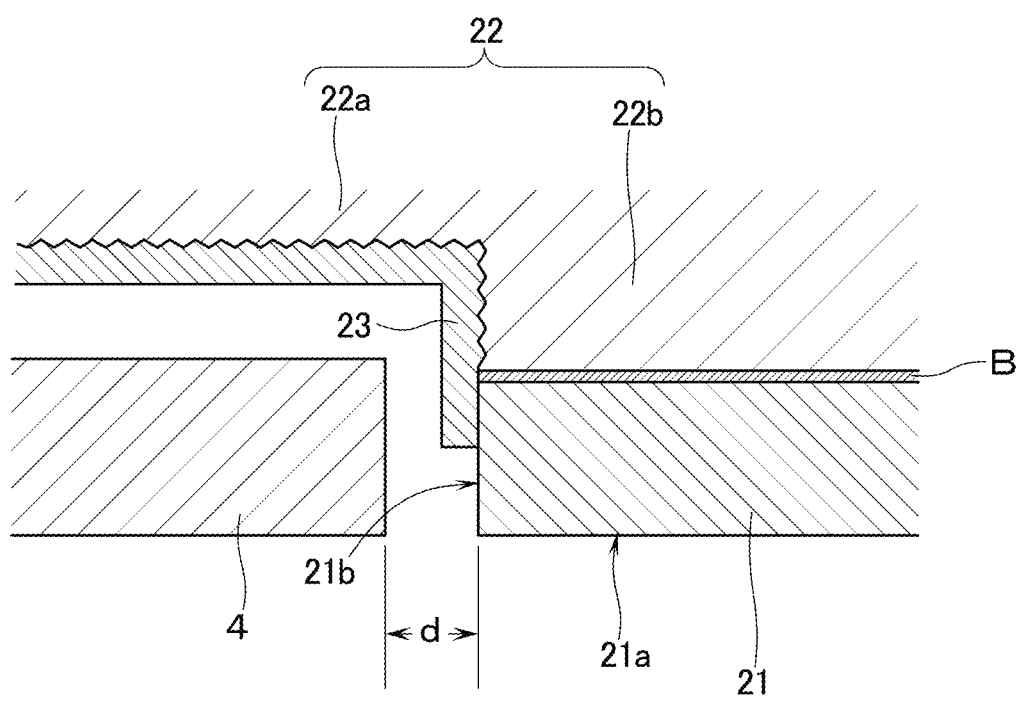
FIG. 2 is a sectional view showing in enlargement essential portion of the target assembly.

At the ceiling portion of the vacuum chamber 1, there is disposed a cathode unit C. The cathode unit C is constituted by a target assembly 2 and a magnet unit 3. With reference also to FIG. 2, the target assembly 2 is made up by integrating: a target 21 made of an insulating material which is appropriately selected depending on the composition of the thin film to be formed; and that backing plate 22 made of a metallic material which is to cool the target 21 at the time of film forming by sputtering. The target 21 and the backing plate 22 are bonded together by means of a bonding material B such as indium, tin and the like. The target 21 has connected thereto an output from a HF power source having a known construction as a sputtering power source E and, during sputtering, AC power is applied. The magnet unit 3 has a known construction in which: a magnetic field is generated in a space below the sputtering surface 21a of the target 21; the electrons and the like that are electrolytically dissociated below the sputtering surface 21a at the time of sputtering are captured; and the sputtered particles scattered from the target 21 are efficiently ionized.

The backing plate 22 has a projected portion 22a which is projected outward and horizontally beyond an outer peripheral end of the target 21. This projected portion 22a is fixed, through an insulating material I, to the vacuum chamber 1. According to this arrangement, the target assembly 2 is assembled onto the sputtering apparatus SM and, in this state, the annular shield plate 4 is disposed to lie opposite to the projected portion 22a. For the purpose of stabilizing the electric discharging and the like, there is secured a clearance d of, e.g., 0.5 mm through 2 mm between the shield plate 4 and the target 21. On a peripheral edge of the shield plate 4, there is provided an upwardly erected side wall portion 4a. A flange portion disposed at an upper end of this side wall portion 4a is fixed to an upper inner wall surface of the vacuum chamber 1, whereby the shield plate 4 is made to be a grounded electric potential. Alternatively, the shield plate 4 may be arranged to be floating.

That portion of the backing plate 22 to which the target 21 gets bonded is defined as a bonding portion 22b. This bonding portion 22b is protruded downward relative to the projected portion 22a. The amount of protrusion, i.e., the length from the lower surface of the bonding portion 22b to the lower surface of the projected portion 22a is set to fall within a range of 0.5 mm through 10 mm. An external surface of the backing plate is roughened over an area from the projected portion 22a to the side surface of the bonding portion 22b. An insulator film 23 is formed to bridge from the projected portion 22a over to a side surface 21b of the target 21.

At the bottom portion of the vacuum chamber 1, there is disposed a stage 5 in a manner to lie opposite to the sputtering surface 21a of the target 2. It is thus so arranged that a substrate W is aligned and held in position with the film-forming surface thereof lying on the upper side. Though not particularly illustrated, the above-mentioned sputtering apparatus SM comprises a known control means provided with a microcomputer, sequencer, and the like. It is thus so arranged that an overall control can be made, by the control means, of the operation of the power source E, of the operation of the mass flow controller 11, of the operation of the vacuum pump P, and the like.

Next, a description will be made of a method of manufacturing the above-mentioned target assembly 2. First, that external surface of the backing plate 22 made of copper which extends from the projected portion 22a to the side surface of the bonding portion 22b is roughened. As the method of roughening the external surface, there may be used a known method such as abrasive blasting method and the like. Then, the target 21 made of aluminum oxide is bonded, through a bonding material B, to the bonding portion 22b of the backing plate 22. As the bonding material B, indium may be used and, as the bonding method, a known method may be used. By the way, roughening of the external surface may also be carried out after the target 21 has been bonded to the backing plate 22. Finally, by forming an insulator film 23 in a manner to bridge from the roughened projected portion 22a over to a side surface of the bonding portion 22b, there can be obtained a target assembly 2. As a method of forming the insulator film 23, there may be appropriately used a known method of spray coating. In this case, the thickness of the insulator film 23 may be set to a range within 0.05 mm through 0.5 mm. If the thickness is above 0.5 mm, stress will remain in the insulator film 23, thereby sometimes resulting in easy peeling off.

A description will now be made of a method of forming an aluminum oxide film on the surface of the substrate W by using the sputtering apparatus SM onto which the target assembly 2 thus manufactured has been assembled. First, after having set in position the substrate W on the stage 6 inside the vacuum chamber 1, the vacuum exhausting means P is operated to thereby evacuate the processing chamber 1a to a predetermined vacuum degree (e.g., $1\times10^{-5}$ Pa). When the inside of the vacuum chamber 1a has reached the predetermined pressure, the mass flow controller 11 is controlled to introduce argon gas at a predetermined flow rate (at this time, the pressure in the processing chamber 1a attains a range between 0.01 Pa through 30 Pa). Together with the above, AC power is applied from the sputtering power source E to the target 21 to thereby form plasma inside the vacuum chamber 1. According to these operations, the sputtering surface 21a of the target 21 gets sputtered, and the scattered sputtering particles will adhere to, and deposit on, the surface of the substrate W, thereby forming an aluminum oxide film.

According to this embodiment, even if there is a clearance between the target 21 and the shield plate 4, that projected portion of the backing plate 22 to which faces the plasma generated between the target 21 and the substrate W, as well as the area extending from the projected portion 22a to the side surface 21b of the target 21, are covered by the insulator film 23. Therefore, there is no possibility of inducing abnormal discharging even if the electrons in the plasma may have been electrostatically built up in the projected portion 22a through the above-mentioned clearance. In addition, an arrangement has been employed in which the backing plate 22 is provided with the bonding portion 22b which is directed in the thickness direction of the target 21 and in which the insulator film 23 is continuously formed to cover an area from the surface of the roughened bonding portion 22b to the side surface 21b of the target 21. Therefore, there can be obtained a construction in which the insulator film 23 is less likely to be peeled off than is the case with the conventional example. As a result, that bonded surface between the target 21 and the backing plate 22 in which the bonding material is present, is covered by the insulator film 23 without exposure. The bonding material B can thus be surely prevented from seeping to the outside.

A description has so far been made of an embodiment of this invention, but this invention is not limited to the above. A description has been made of the material in which the insulator film is made, by citing an example of aluminum oxide. Without being limited to the above, other insulating materials such as magnesium oxide can be appropriately selected. In addition, the target 21 and the insulating film 23 may be different in material from each other.

In the above-mentioned embodiment, a description has been made of a case in which the bonding portion 22b has an outer dimension equivalent to that of the target 21, and in which the film thickness of the insulator film 23 to cover the side surface of the bonding portion 22b is equivalent to the film thickness of the insulator film 23 to cover the side surface 21b of the target. However, as shown in FIG. 3, the bonding portion 22b may have an outer dimension smaller than the outer dimension of the target 21 (as a result of this, the side surface 21b of the bonding portion 22b is located on an inner side than the side surface 21b of the target). The film thickness of the insulator film 23 that covers the side surface of the bonding portion 22b may be made thicker than the film thickness of the insulator film 23 that covers the side surface 21b of the target. According to this arrangement, the insulating characteristics of the insulator film 23 are enhanced, thereby more surely preventing the abnormal discharging from taking place. At the same time, adhesive properties of the insulator film 23 at the side surface of the bonding portion 22b can be enhanced, thereby surely preventing the insulator film 23 from getting peeled off.

Further, as shown in FIG. 4, that peripheral edge of the bonding portion 22b which is along the surface bonded with the target 21, and that peripheral edge of the target which is along the surface bonded with the bonding portion 22b are respectively chamfered. An insulator film 23 may be formed by embedding in a recessed portion CP that is defined by the chamfered bonding portion 22b and the target 21. According to this arrangement, the thickness of the insulator film 23 that covers the bonded surface of the target 21 with the backing plate 22 can be made larger than that of the surrounding area so that the insulator film 23 can be made still more difficult to be peeled off. Also the bonding material can be more surely prevented from seeping to the outside.

Figure 5A:
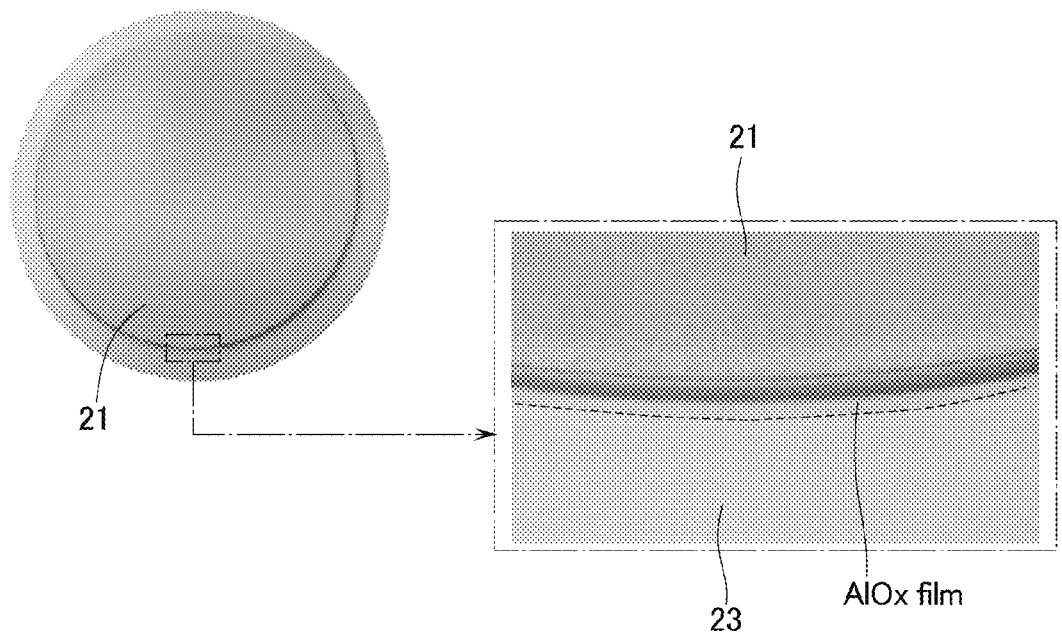
FIGS. 5(a) and 5(b) are photographs showing the results of experiments to confirm the effects of this invention.
Figure 5B:
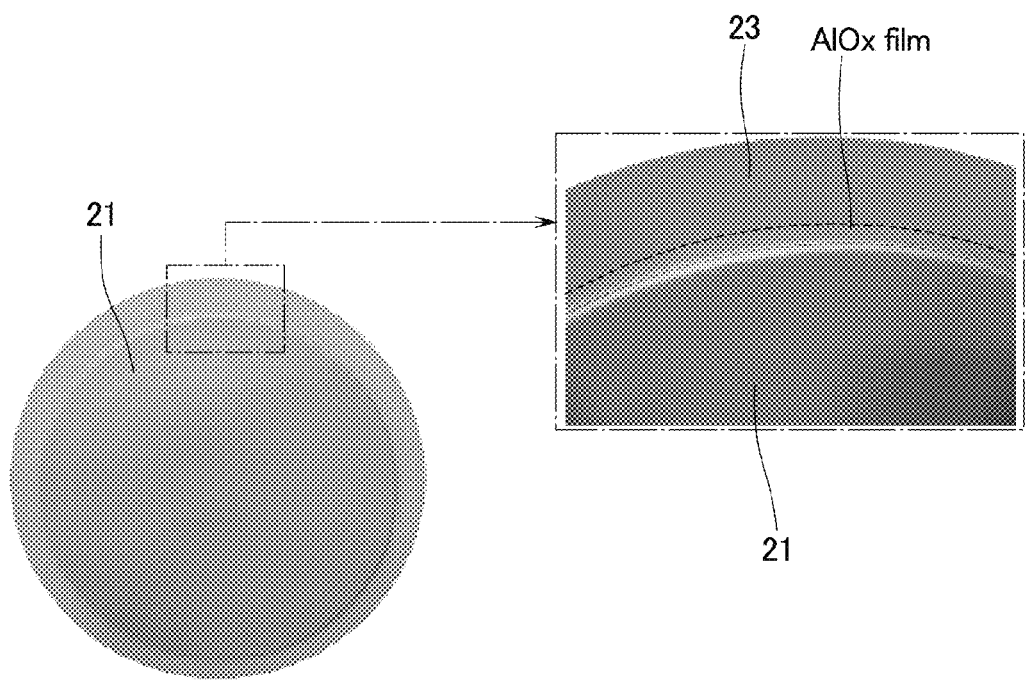

Next, in order to confirm the above-mentioned effects, the following experiments were carried out by using the above-mentioned sputtering apparatus SM. In these experiments, as the substrate W, a Si substrate of φ200 mm (in diameter) was used. As the target assembly 2 there was used one having bonded together, by means of indium B, a target 21 of aluminum oxide of φ300 mm (in diameter) and a backing plate 22 of copper. After having set in position the substrate W on the stage 5 inside the vacuum chamber 1 onto which this target assembly has been assembled, an aluminum oxide film was formed on the surface of the substrate W in the sputtering method. By combining the following first and second film-forming conditions, continuous processing (continuous electric discharging) was carried out toward a plurality of substrates W. The first film-forming conditions were: argon gas flow rate of 29 sccm (pressure inside the processing chamber 1a of 0.15 Pa); and applied power to the target 21 of 13.56 MHz, 2 kW. The second film-forming conditions were: argon gas flow rate of 105 sccm (pressure inside the processing chamber 1a of 1.9 Pa); and applied power to the target 21 of 13.56 MHz, 2 kW (power density in both film-forming conditions of 0.028 W/mm$^2$). During film forming under the first and the second film-forming conditions, Vdc (corresponding to the electric potential difference between the projected portion 22a and the target 21) was measured. It has then been confirmed that Vdc had not been generated. When the target assembly 2 was confirmed after 20 kWh, as shown in FIG. 5(a), there were found no traces of abnormal discharging (uniform black points), although AlOx film was found to have been adhered to the surface of the insulator film 23 in the neighborhood of the side surface of the target 21. However, there was found no trace (uniform black point) of abnormal discharging. Further, in a similar manner with respect to the target assembly after 49.28 kWh, as shown in FIG. 5(b), there was found no trace of abnormal discharging. Still furthermore, upon elemental analysis of the aluminum oxide film that was formed on the surface of the substrate W, it has been confirmed that copper and indium have not been mixed into the aluminum oxide film. Judging from the above, it has been found that, while retarding the occurrence of abnormal discharging between the projected portion 22a and the side surface of the target 21, the bonding material was prevented from seeping to the outside.

Further, continuous processing (continuous discharging) was carried out under the third film-forming conditions of higher power density. The third film-forming conditions were: argon gas flow rate of 105 sccm (pressure inside the processing chamber 1a of 1.9 Pa); and applied power to the target 21 of 13.56 MHz, 4 kW (power density of 0.057 W/mm$^2$). Upon measurement of the Vdc in the course of processing, it has been confirmed that Vdc has not been generated.

EXPLANATION OF REFERENCE CHARACTERS

SM sputtering apparatus
2 target assembly
21 target made of an insulating material
B bonding material
22 backing plate
22a projected portion
22b bonding portion
23 film made of an insulating material (an "insulator film")
4 shield plate
CP recessed portion

The invention claimed is:

1. A target assembly comprising:
a target made of an insulating material; and
a backing plate bonded to one surface of the target by a bonding material, the backing plate including a bonding portion and a projected portion which is projected outward beyond an outer peripheral end of the target, and the backing plate bonded to the target at the bonding portion, and
wherein an annular shield plate is disposed to lie opposite to the projected portion so as to enclose the target in a state in which the target assembly is assembled onto a sputtering apparatus,
the bonding portion is protruded relative to the projected portion,
an external surface of the backing plate is roughened over an area from the projected portion to a side surface of the bonding portion,
an insulator film is formed to bridge from the projected portion over into a side surface of the target,
the insulator film is formed thicker at a recessed portion than at an external surface area where the external surface is roughened, the recessed portion being defined between a chamfered bonding portion and a chamfered target, the chamfered bonding portion formed by a peripheral edge of the bonding portion which is at the side surface bonded with the target, and the chamfered target formed by a peripheral edge of the target which is at the side surface bonded with the bonding portion.

2. The target assembly according to claim 1, wherein the insulator film is formed by spray coating.

* * * * *